US010957701B1

(12) United States Patent
Shen et al.

(10) Patent No.: US 10,957,701 B1
(45) Date of Patent: Mar. 23, 2021

(54) FIN-BASED ANTI-FUSE DEVICE FOR INTEGRATED CIRCUIT (IC) PRODUCTS, METHODS OF MAKING SUCH AN ANTI-FUSE DEVICE AND IC PRODUCTS COMPRISING SUCH AN ANTI-FUSE DEVICE

(71) Applicant: GLOBALFOUNDRIES U.S. Inc., Santa Clara, CA (US)

(72) Inventors: HongLiang Shen, Ballston Lake, NY (US); Meixiong Zhao, Ballston Lake, NY (US); Guoxiang Ning, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/679,458

(22) Filed: Nov. 11, 2019

(51) Int. Cl.
*G11C 17/00* (2006.01)
*H01L 27/112* (2006.01)
*G11C 17/18* (2006.01)
*G11C 17/16* (2006.01)
*H01L 23/528* (2006.01)

(52) U.S. Cl.
CPC ........ *H01L 27/11206* (2013.01); *G11C 17/16* (2013.01); *G11C 17/18* (2013.01); *H01L 23/528* (2013.01)

(58) Field of Classification Search
CPC . H01L 27/11206; H01L 23/528; G11C 17/16; G11C 17/18
USPC .......................................................... 365/96
See application file for complete search history.

(56) References Cited

U.S. PATENT DOCUMENTS

| 5,412,245 | A | 5/1995 | Favreau |
| 6,465,282 | B1 | 10/2002 | Tobben et al. |
| 7,087,499 | B2 | 8/2006 | Rankin et al. |
| 8,471,296 | B2 * | 6/2013 | Cheng ................. H01L 23/5256 257/209 |
| 8,569,116 | B2 * | 10/2013 | Mann ...................... H01L 23/62 438/132 |
| 9,142,316 | B2 * | 9/2015 | Liu .................... H01L 27/11206 |
| 9,159,734 | B2 * | 10/2015 | Hafez ................. H01L 23/5252 |
| 9,177,963 | B2 * | 11/2015 | Mittal ............... H01L 27/11206 |
| 9,412,746 | B2 * | 8/2016 | Yang ............... H01L 21/823475 |
| 9,431,497 | B2 * | 8/2016 | Toh .................... H01L 29/66795 |
| 9,589,970 | B1 * | 3/2017 | Tseng ................. H01L 29/0653 |
| 9,728,542 | B1 * | 8/2017 | Balakrishnan .... H01L 29/78642 |

(Continued)

*Primary Examiner* — Viet Q Nguyen
(74) *Attorney, Agent, or Firm* — Anthony Canale; Hoffman Warnick LLC (57) ABSTRACT

One IC product disclosed herein includes, among other things, a semiconductor substrate, a first anti-fuse device formed on the semiconductor substrate, the first anti-fuse device comprising at least one first fin formed with a first fin pitch, a first source region and a first drain region, wherein the first anti-fuse device is adapted to breakdown when a first programing voltage is applied to the first anti-fuse device, and a second anti-fuse device formed on the semiconductor substrate, the second anti-fuse device comprising at least one second fin formed with a second fin pitch, a second source region and a second drain region, wherein the second anti-fuse device is adapted to breakdown when a second programing voltage is applied to the second anti-fuse device, wherein the first fin pitch is greater than the second fin pitch and wherein the first programming voltage is greater than the second programing voltage.

12 Claims, 8 Drawing Sheets

(56) References Cited

U.S. PATENT DOCUMENTS

| | | | |
|---|---|---|---|
| 9,754,875 B1* | 9/2017 | Fogel | H01L 29/66545 |
| 9,806,084 B1* | 10/2017 | Cheng | H01L 29/66628 |
| 9,831,254 B1* | 11/2017 | Adusumilli | H01L 23/5252 |
| 9,852,982 B1* | 12/2017 | Pei | H01L 29/66795 |
| 9,917,090 B1 | 3/2018 | Cheng et al. | |
| 9,935,113 B2* | 4/2018 | Wu | G11C 7/22 |
| 10,043,746 B1* | 8/2018 | Cheng | H01L 21/3086 |
| 2006/0076643 A1* | 4/2006 | Breitwisch | H01L 23/5252 |
| | | | 257/530 |
| 2013/0270559 A1* | 10/2013 | Hafez | H01L 27/0924 |
| | | | 257/50 |
| 2013/0307115 A1 | 11/2013 | Filippi et al. | |
| 2017/0162503 A1* | 6/2017 | Olac-Vaw | H01L 29/42376 |
| 2017/0207216 A1* | 7/2017 | Peng | H01L 21/30604 |
| 2018/0053767 A1* | 2/2018 | Cheng | H01L 23/5252 |
| 2018/0122800 A1* | 5/2018 | Cheng | H01L 21/764 |

* cited by examiner

Fig. 11

FIN-BASED ANTI-FUSE DEVICE FOR INTEGRATED CIRCUIT (IC) PRODUCTS, METHODS OF MAKING SUCH AN ANTI-FUSE DEVICE AND IC PRODUCTS COMPRISING SUCH AN ANTI-FUSE DEVICE

BACKGROUND

Field of the Invention

The present disclosure generally relates to various novel embodiments of a fin-based anti-fuse device for an integrated circuit (IC) product, various novel methods of making such an anti-fuse device and IC products comprising such an anti-fuse device.

Description of the Related Art

Anti-fuses are commonly employed in modern IC products. An anti-fuse is an electrical device that performs the opposite function to a fuse. An anti-fuse is activated to create a connection between two or more conductors. In one example, anti-fuses may be employed for one-time programming purposes. Anti-fuses can be employed for several purposes. For example, an anti-fuse can be used to repair DRAM arrays by swapping defective cells with redundant cells. An anti-fuse can also be used for product configuration and for updating and repairing IC products The present disclosure is generally directed to various novel embodiments of a fin-based anti-fuse device for an integrated circuit (IC) product, various novel methods of making such an anti-fuse device and IC products comprising such an anti-fuse device.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to various novel embodiments of a fin-based anti-fuse device for an integrated circuit (IC) product, various novel methods of making such an anti-fuse device and IC products comprising such an anti-fuse device. One illustrative IC product disclosed herein includes, among other things, a semiconductor substrate, a first anti-fuse device formed on the semiconductor substrate, the first anti-fuse device comprising at least one first fin formed with a first fin pitch, a first source region and a first drain region, wherein the first anti-fuse device is adapted to breakdown when a first programing voltage is applied to the first anti-fuse device, and a second anti-fuse device formed on the semiconductor substrate, the second anti-fuse device comprising at least one second fin formed with a second fin pitch, a second source region and a second drain region, wherein the second anti-fuse device is adapted to breakdown when a second programing voltage is applied to the second anti-fuse device, wherein the first fin pitch is greater than the second fin pitch and wherein the first programming voltage is greater than the second programing voltage.

Another illustrative product disclosed herein includes, among other things, a semiconductor substrate, a first anti-fuse device formed on the semiconductor substrate, the first anti-fuse device comprising a plurality of first fins formed with a first fin pitch, a first source region and a first drain region, wherein each of the plurality of first fins comprises a first upper surface with a first width and wherein the first anti-fuse device is adapted to breakdown when a first programing voltage is applied to the first anti-fuse device, and a second anti-fuse device formed on the semiconductor substrate, the second anti-fuse device comprising a plurality of second fins formed with a second fin pitch, a second source region and a second drain region, wherein each of the plurality of first fins comprises a second upper surface with a second width and wherein the second anti-fuse device is adapted to breakdown when a second programing voltage is applied to the second anti-fuse device, wherein the first fin pitch is greater than the second fin pitch, the first programming voltage is greater than the second programing voltage and wherein the first width is greater than the second width.

One illustrative method disclosed herein includes, among other things, identifying a desired breakdown voltage for a specified programing voltage for an anti-fuse device, the anti-fuse device comprising at least one fin, a source region and a drain region, determining a target fin pitch for the at least one fin such that, when the at least one fin is formed, an upper surface of the at least one fin will have a width that will result in the breakdown of the anti-fuse device at the desired breakdown voltage when the specified programing voltage is applied to the anti-fuse device, and forming the at least one fin in a semiconductor substrate, wherein the at least one fin was formed with the target fin pitch.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-11 depict various novel embodiments of a fin-based anti-fuse device for an integrated circuit (IC) product, various novel methods of making such an anti-fuse device and IC products comprising such an anti-fuse device. In the illustrative examples depicted herein, two illustrative anti-fuse devices 100A, 100B (collectively referenced using the numeral 100) will be formed above a semiconductor substrate 102. As will be appreciated by those skilled in the art after a complete reading of the present application, the anti-fuse devices 100 disclosed herein may be formed on a bulk semiconductor substrate or a semiconductor-on-insulator substrate. Additionally, the gate structure of the anti-fuse devices 100 disclosed herein may be manufactured using known gate-first or replacement gate manufacturing techniques. In the examples shown herein, the anti-fuse device 100A comprises two illustrative fins 103A and the anti-fuse device 100B comprises two illustrative fins 103B (collectively the fins 103A, 103B will be referenced using the numeral 103). However, each of the anti-fuse devices 100 may comprise any number of fins 103 (e.g., a single fin 103 or more than two fins 103) and the anti-fuse devices 100 need not have the same number of fins 103, although that may be the case in some applications.

The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. However, as noted above, the various inventions disclosed herein should not be considered to be limited to the particular example shown in the attached drawings and described below.

Figure 1:
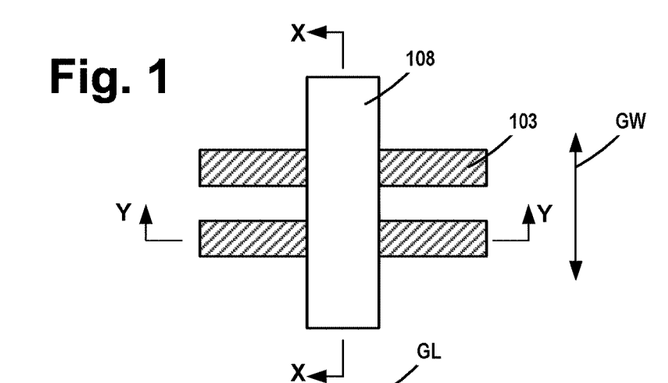
FIGS. 1-11 depict various novel embodiments of a fin-based anti-fuse device for an integrated circuit (IC) product, various novel methods of making such an anti-fuse device and IC products comprising such an anti-fuse device.

FIG. 1 is a simplistic plan view of one illustrative embodiment of an anti-fuse device 100 that may be formed using the methods described herein. The location where various cross-sectional views ("X-X" and "Y-Y") of the anti-fuse devices 100 shown in some of the attached drawings are indicated in FIG. 1. The cross-sectional view X-X is taken in a direction corresponding to the gate length (GL) direction of the anti-fuse devices 100. The cross-sectional view Y-Y is taken in a direction corresponding to the gate width (GW) direction of the anti-fuse devices 100. The drawings are not to scale.

As disclosed more fully below, using the methods and techniques disclosed herein, the anti-fuse devices 100A, 100B may be formed so as to have different breakdown voltages. In the particular example disclosed herein, the anti-fuse devices 100 will be formed in such a manner so that the anti-fuse device 100A has a higher breakdown voltage than the anti-fuse device 100B.

Figure 2:
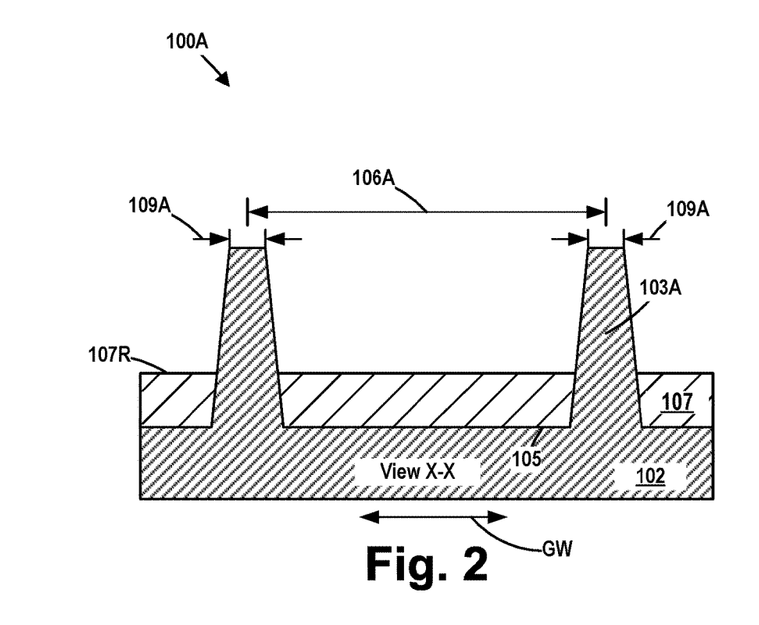
Figure 3:
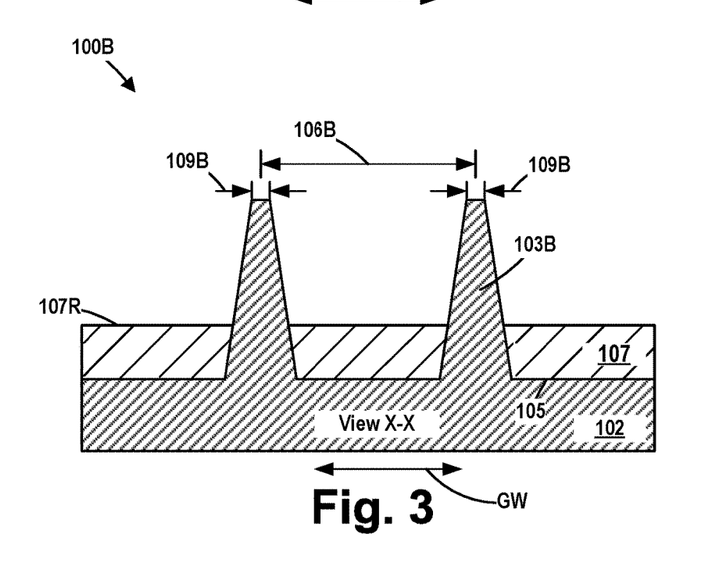

FIGS. 2 and 3 are cross-sectional views of the anti-fuse device 100A and the anti-fuse device 100B, respectively, at a relatively early stage of fabrication. The views shown in FIGS. 2 and 3 are taken through the location where the gate structure 108 will be formed, i.e., in the gate-width direction of the anti-fuse devices 100. FIGS. 2 and 3 depict the anti-fuse devices 100 after several process operations were performed. First, the fins 103 were formed in the substrate 102 by performing one or more etching processes, e.g., anisotropic etching processes, through a patterned fin-formation etch mask (not shown) to form a plurality of fin-formation trenches 105 in the substrate 102 and thereby define a plurality of fins 103. Next, a layer of insulating material 107 (e.g., silicon dioxide) was deposited so as to overfill the fin-formation trenches 105. A chemical mechanical polishing (CMP) process was then performed to planarize the upper surface of the layer of insulating material 107 with the upper surface of the fins 103, thereby removing the patterned fin-formation hard mask. Next, a recess etching process was performed on the layer of insulating material 107 such that it has a recessed upper surface 107R that exposes a desired amount of the fins 103 above the recessed upper surface 107R.

Importantly, the fins 103A on the anti-fuse device 100A were formed with a fin pitch 106A while the fins 103B on the anti-fuse device 100B were formed with a fin pitch 106B, wherein the fin pitch 106A is greater than the fin pitch 106B. The absolute magnitude of the fin pitch 106A and the fin pitch 106B, as well as the magnitude of the difference between the fin pitch 106A and the fin pitch 106B may vary depending upon the particular application. As one illustrative example, and not by way of limitation, based upon current-day technology, the fin pitch 106A may be about 60 nm and the fin pitch 106B may be about 36 nm.

Due to the formation of the fins 103 with different fin pitches, the fins 103A on the anti-fuse device 100A have a different configuration than do the fins 103B on the anti-fuse device 100B. More specifically, the fins 103A have an upper surface dimension 109A (CD) in the gate width direction while the fins 103B have an upper surface dimension 109B (CD), wherein the upper surface dimension 109A is greater than the upper surface dimension 109B. The absolute magnitude of the upper surface dimension 109A and the upper surface dimension 109B, as well as the magnitude of the difference between the upper surface dimension 109A and the upper surface dimension 109B may vary depending upon the particular application. As one illustrative example, and not by way of limitation, based upon current-day technology, the upper surface dimension 109A may be about 7 nm and the upper surface dimension 109B may be about 5 nm.

Stated another way, due to the smaller fin pitch 106B, the fins 103B are more tapered or more pointed than the fins 103A. More specifically, the upper surface of the fins 103B is more pointed and less rounded than the upper surface of the fins 103A on the anti-fuse device 100A. As a result of the difference in the configuration of the fins 103A, 103B, the breakdown voltage of the anti-fuse device 100A will be greater than the breakdown voltage of the anti-fuse device 100B. As one illustrative example, and not by way of limitation, based upon current-day technology, an anti-fuse device disclosed herein with fins 103 formed with a fin pitch of approximately 60 nm, 48 nm, 42 nm and 36 nm may have a breakdown voltage of approximately 1.4 volts, 1.2 volts, 1.0 volts and 0.8 volts, respectively.

Importantly, by varying the fin pitch, the breakdown voltage of an anti-fuse device disclosed herein can be tuned or designed to have a specific breakdown voltage for a particular application or circuit. Additionally, if there is a target value for the breakdown voltage of an anti-fuse device that is required or desired by a customer for a particular application, the fin pitch on the anti-fuse device can be established prior to manufacturing so as to ultimately produce the anti-fuse device that has the targeted or specified breakdown voltage.

Figure 4:
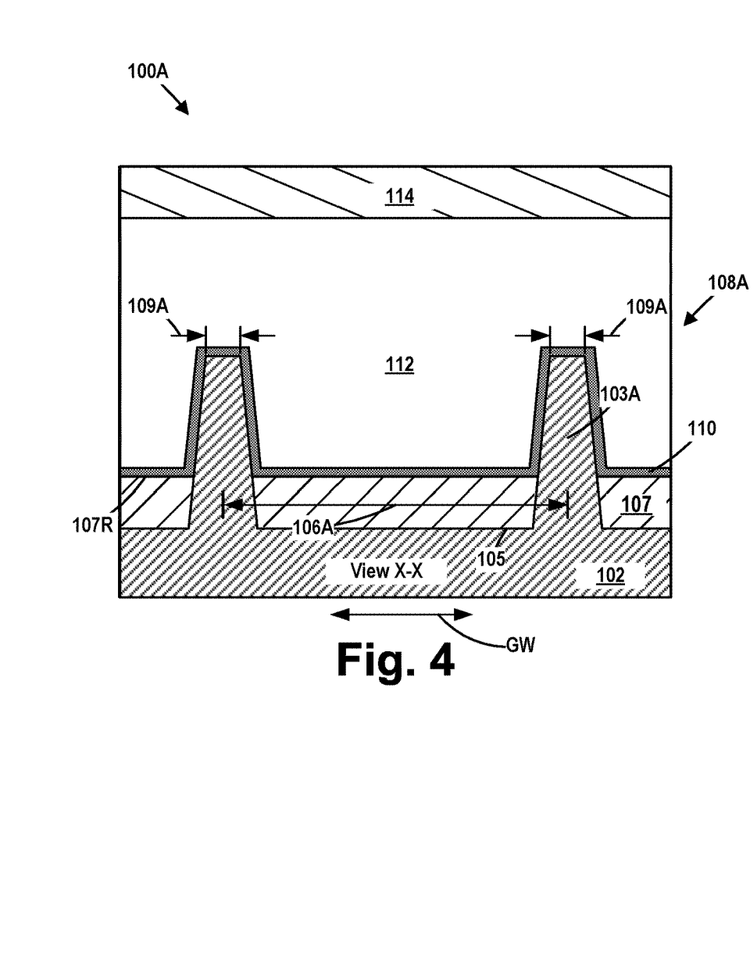
Figure 5:
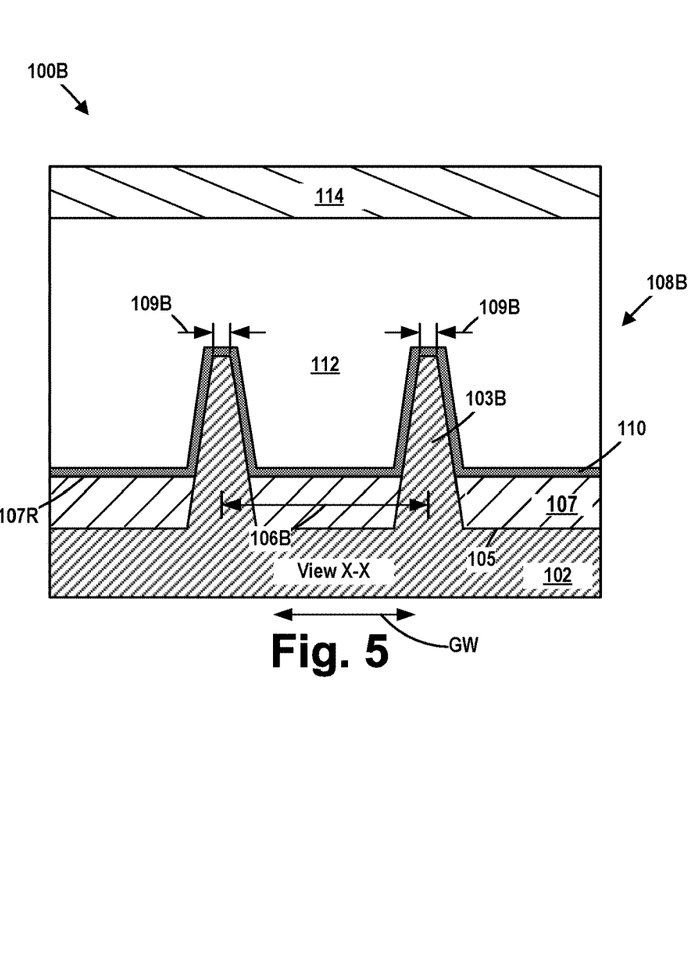

FIGS. 4 and 5 depict the anti-fuse devices 100 after the formation of gate structures 108A, 108B (collectively referenced using the numeral 108) on the anti-fuse devices 100A, 100B, respectively, and after formation of a gate cap 114 on each of the gate structures 108. As noted above, the gate structures 108 may be formed using known replacement gate or gate-first manufacturing techniques. The materials of construction for the gate structures 108A and 108B may be the same, but that may not be the case in all applications. The gate structures 108 depicted herein are intended to be representative in nature, they represent any type of gate structure that may be formed on an IC product. The gate structures 108 typically comprise a gate insulation layer 110, e.g., a layer of silicon dioxide, a high-k material (having a k value of at least 10), and one or more layers of conductive material 112 that function as the conductive gate electrode of the gate structure 108. The gate cap 114 may be comprised of a variety of materials, e.g., silicon nitride.

Figure 6:
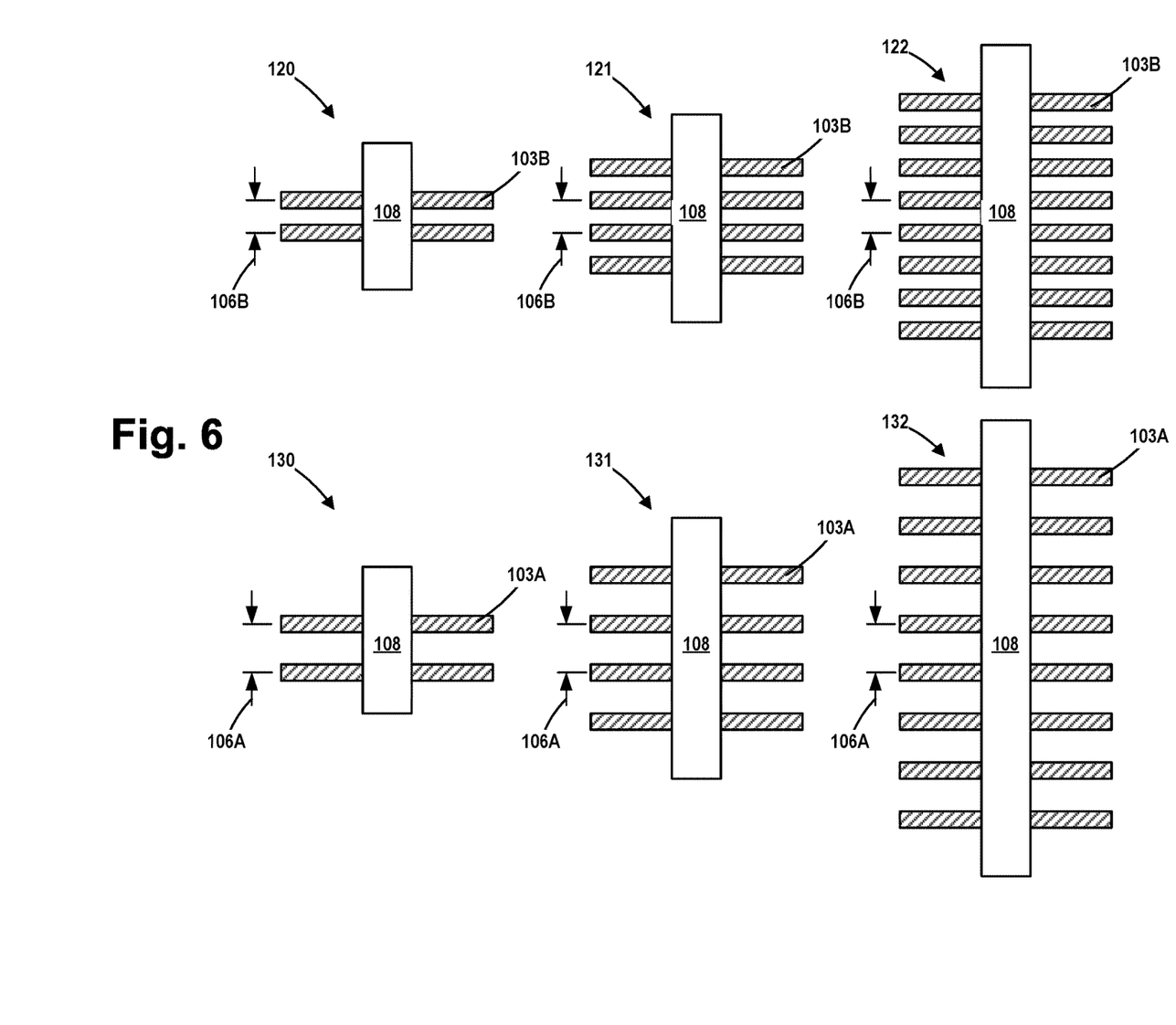

FIG. 6 depicts six illustrative embodiments of various anti-fuse devices 100 disclosed herein. The anti-fuse devices in the upper portion of FIG. 6 have been identified with the numerals 120, 121 and 122 for reference purposes. The anti-fuse devices in the lower portion of FIG. 6 have been identified with the numerals 130, 131 and 132 for reference purposes. The fins 103B for the anti-fuse devices 120, 121 and 122 have all been formed with the smaller fin pitch 106B. The fins 103A for the anti-fuse devices 130, 131 and 132 have all been formed with the larger fin pitch 106A.

With continued reference to FIG. 6, all of the anti-fuse devices 120, 121 and 122 have substantially the same breakdown voltage. All of the anti-fuse devices 130, 131 and 132 have substantially the same breakdown voltage, but the breakdown voltage for the anti-fuse devices 130, 131 and 132 is greater than the breakdown voltage for the anti-fuse devices 120, 121 and 122. Accordingly, the anti-fuse devices 130, 131 and 132, respectively, have a higher breakdown voltage that the anti-fuse devices 120, 121 and 122, respectively.

As depicted in FIG. 6, the anti-fuse devices 120, 121 and 122, respectively, comprise two, four and eight, respectively, of the fins 103B. The anti-fuse devices 130, 131 and 132, respectively, also comprise two, four and eight, respectively, of the fins 103A. The number of fins 103 may increase the current that flows through the anti-fuse device 100 once it has been programmed or activated by application of a programing voltage as described more fully below. Additionally, increasing the number of fins in the anti-fuse device increases programming reliability.

Figure 7:
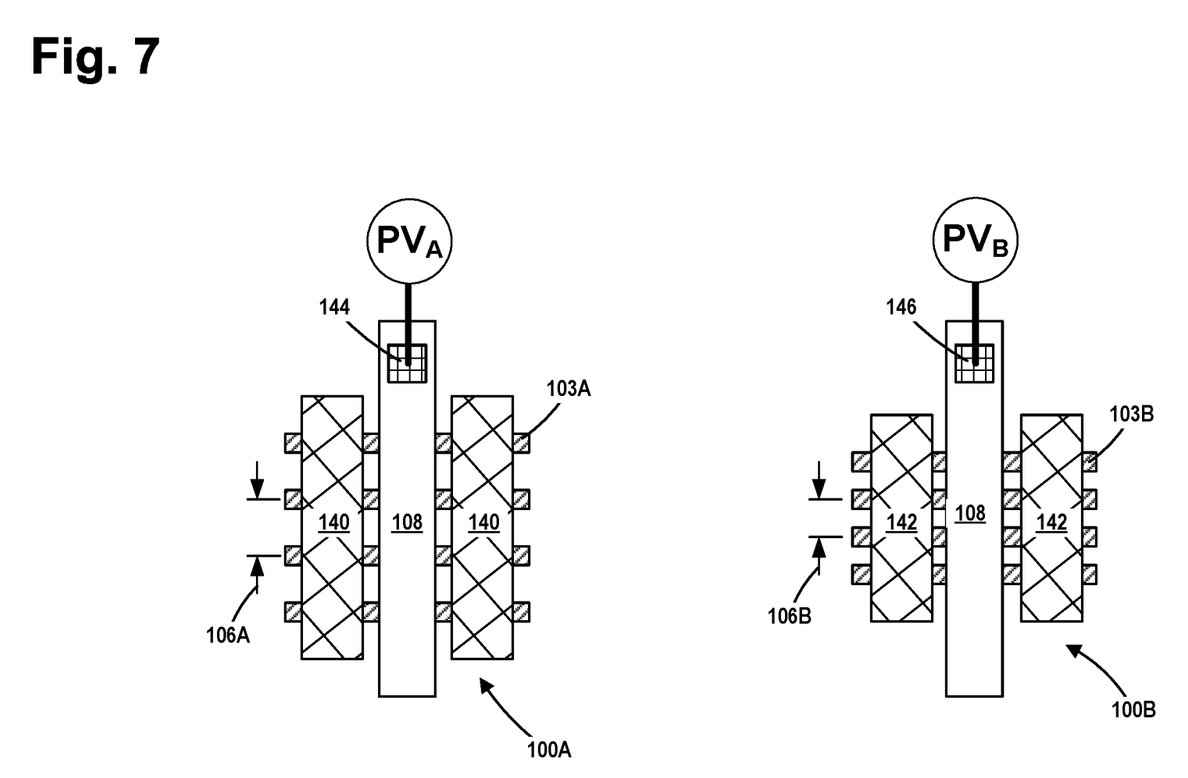

FIG. 7 schematically depicts one illustrative technique for applying the appropriate programing voltages to the anti-fuse devices 100A, 100B. The illustrative anti-fuse devices 100 shown in FIG. 7 each comprise four illustrative fins 103. Also depicted n FIG. 7 are illustrative source/drain contact structures 140, 142, respectively, (e.g., trench silicide structures) that are formed on the anti-fuse devices 100A, 100B, respectively. In the depicted example, the source/drain contact structures 140, 142 are, respectively, conductively coupled to all of the fins 103A (of the anti-fuse device 100A) and all of the fins 103B (of the anti-fuse device 100B). Illustrative gate contact structures 144, 146, respectively, have been formed that conductively contact the gate electrode 112 of the gate structure 108 of the anti-fuse devices 100A, 100B, respectively. In the depicted example, the gate contact structures 144, 146 are positioned over insulating material (not shown in FIG. 7) positioned above the substrate and outside of the active region of the devices.

As depicted, in one illustrative example, a programing voltage $PV_A$ is adapted to be applied to the gate electrode structure 112 of the anti-fuse device 100A to program or activate the anti-fuse device 100A, i.e., to break down the gate insulation layer 110 of the gate structure 108 so as to create a conductive connection between the gate electrode structure 112 and the source/drain regions of the anti-fuse device 100A. Similarly, a programing voltage $PV_B$ is adapted to be applied to the gate electrode structure 112 of the anti-fuse device 100B to program or activate the anti-fuse device 100B, i.e., to break down the gate insulation layer 110 so as to create a conductive connection between the gate electrode structure 112 and the source/drain regions of the anti-fuse device 100B. Since the fin pitch 106A on the anti-fuse device 100A is larger than the fin pitch 106B on the anti-fuse device 100B, the programing voltage $PV_A$ is larger than the programing voltage $PV_B$. The absolute magnitude of the programing voltage $PV_A$ and the programing voltage $PV_B$, as well as the magnitude of the difference between the programing voltage $PV_A$ and the programing voltage $PV_B$ may vary depending upon the particular application. The source of the programming voltages $PV_A$ and $PV_B$ may be conductively coupled to the anti-fuse devices 100A, 100B, by a variety of different forms of conductive lines and members that are routinely formed on IC products.

Figure 8:
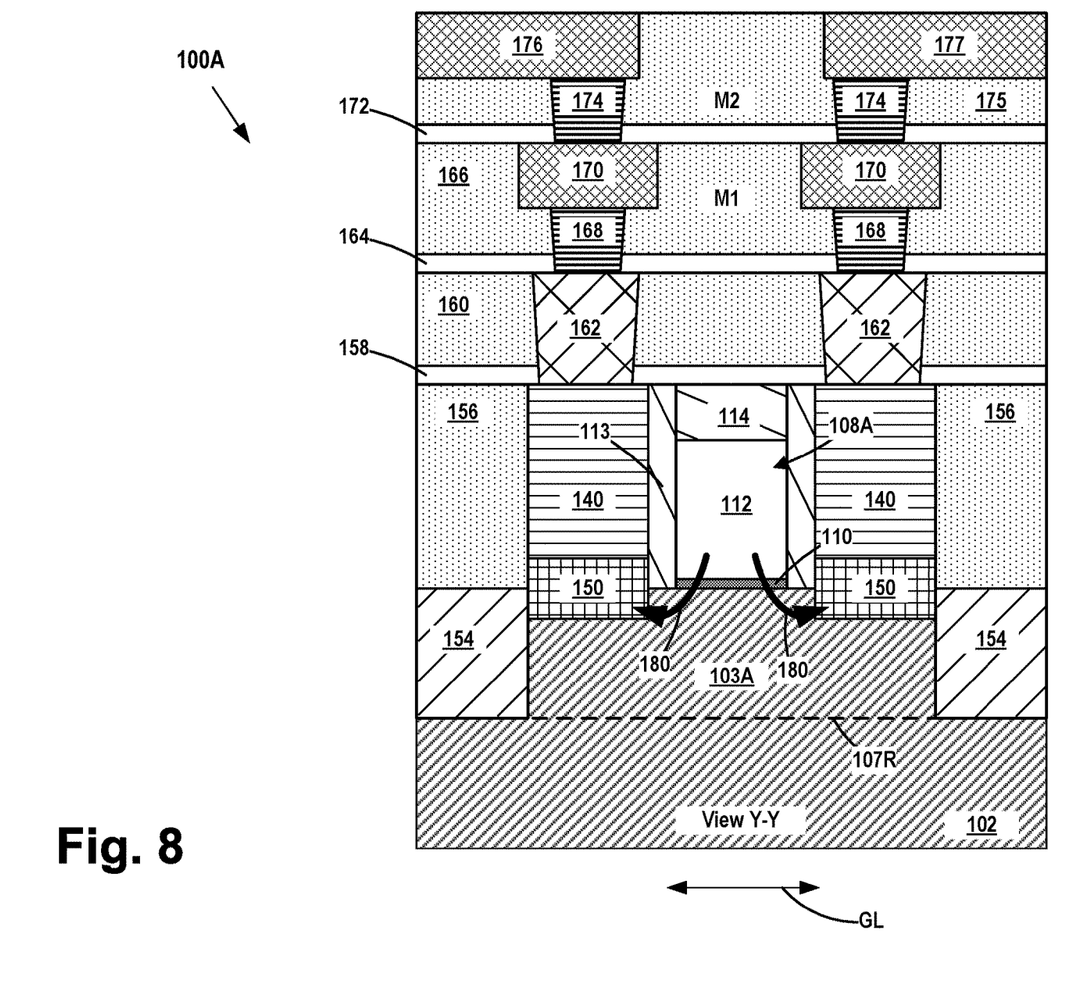
Figure 9:
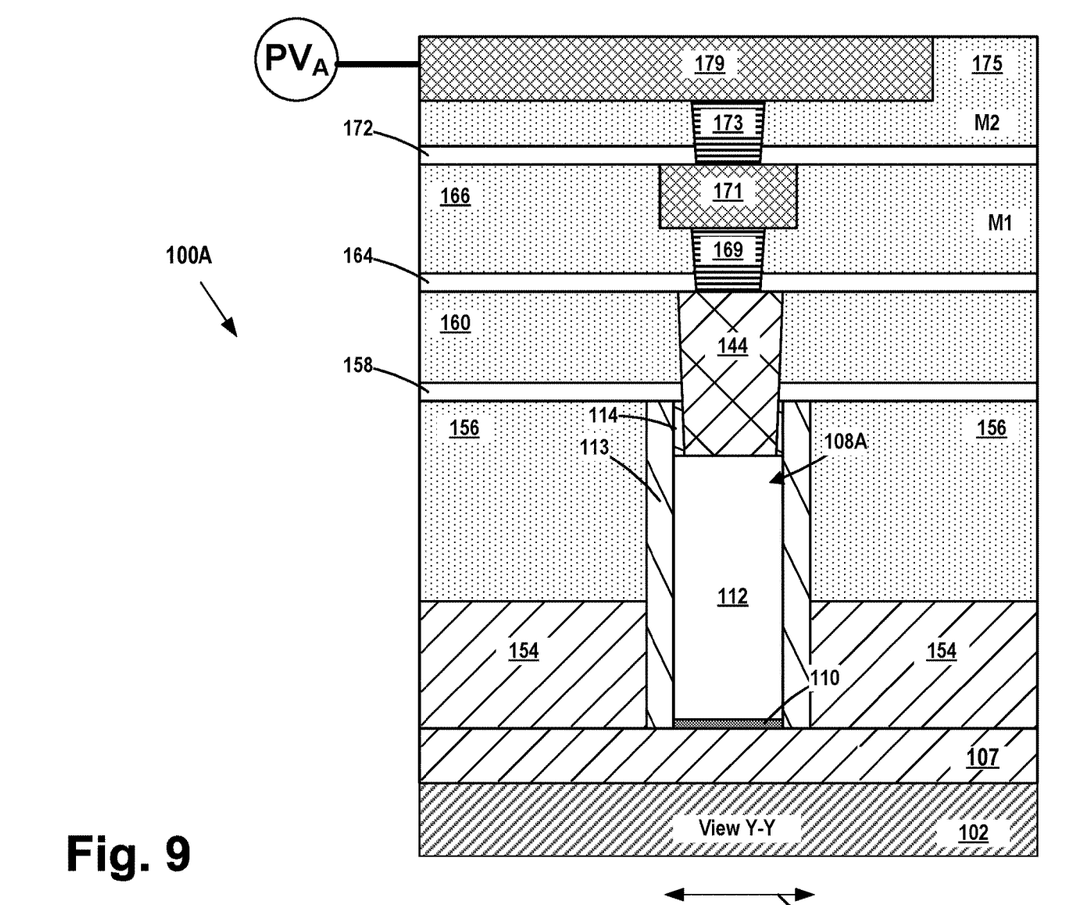

FIGS. 8 and 9 are views depicting one illustrative example of various conductive structures that may be used for applying the programing voltage $PV_A$ to the anti-fuse device 100A. FIG. 8 is a cross-sectional view (Y-Y) of the anti-fuse device 100A showing one possible arrangement for certain illustrative structures that may be used for applying the programing voltage $PV_A$ to the anti-fuse device 100A. The view in FIG. 8 is taken through the gate structure 108A and one of the fins 103A in a direction corresponding to the gate length (GL) of the anti-fuse device 100A. FIG. 9 is a cross-sectional view taken through the gate structure 108A at a location wherein the gate contact structure 144 (see FIG. 7) will be formed. As noted above, in the depicted example, the gate electrode 112 of the anti-fuse device 100A will be contacted at a location that is positioned vertically above isolation material 107.

An isolation structure 154 (e.g., STI) was formed in the substrate to electrically isolate the anti-fuse device 100A. The isolation structure 154 may be comprised of a variety of materials, e.g., silicon dioxide, silicon nitride, etc., it may be formed by performing a variety of known manufacturing techniques. Also depicted is an illustrative sidewall spacer 113 positioned adjacent the gate structure 108. The sidewall spacer 113 may be comprised of a variety of materials, e.g., SiNC, SiN, SiCO, SiNOC, etc., and it may be formed by performing a variety of known manufacturing techniques. In one illustrative embodiment, the spacer 113 may be made of a low-k material (i.e., a material having a dielectric constant less than 7).

Also depicted in FIG. 8 are regions of epi semiconductor material 150 that were formed on the exposed portions of the fins 103A in the source/drain regions of the anti-fuse device 100A by performing an epitaxial growth process. The epi material 150 may be formed to any desired thickness. However, it should be understood that the epi material 150 need not be formed in all applications. Other layers of material, such as contact etch stop layers and the like, are not depicted in the drawings. Also depicted in FIG. 8 are the above-described source/drain contact structures 140 that are conductively coupled to the regions of epi semiconductor material 150.

As is typical, the IC product includes a plurality of metallization layers that constitute the overall wiring pattern for the IC product. These metallization layers may be formed on the IC product by performing traditional manufacturing processes. These metallization layers are typically comprised of layers of insulating material(s) (e.g., silicon dioxide, silicon nitride, SiCOH, etc.) with a plurality of conductive metal lines and conductive vias formed in the layers of insulating materials. The conductive metal lines are routed across the substrate in various patterns and arrangements and provide the means for intra-layer electrical communication between the devices and structures formed on or above the substrate. The conductive vias provide the means for allowing electrical communication between the conductive metal lines in adjacent metallization layers. The first metallization layer of an IC product is typically referred to as the "M1" layer (or in some cases the "M0" layer), while the conductive vias that are used to establish electrical connection between the M1 layer and the conductive lines in the immediately adjacent upper metallization layer (the "M2" layer) are typically referred to as "V1" vias.

Accordingly, FIGS. 8 and 9 depict the IC product after various illustrative layers of insulating material 156, 160, 166 and 175, e.g. silicon dioxide, a low-k material, etc., were formed on the product and they may be formed to any desired thickness. Also depicted are various illustrative etch-stop layers 158, 164 and 172. The etch-stop layers 158, 164, 172 may be comprised of a variety of different materials, e.g., silicon nitride, and they also may be formed to any desired thickness.

FIG. 8 depicts individual source/drain contact structures 162 formed in openings that were formed in the layer of insulating material 160 and the etch stop layer 158 by performing known masking, etching, deposition and CMP process operations. The source/drain contact structures 162 may be comprised of any conductive material, e.g., tungsten, copper, etc. As shown in FIG. 9, at or near the time the source/drain contact structures 162 are formed, the gate contact structure 144 (see FIG. 7) was formed as well using techniques that are known to those skilled in the art. More specifically, the gate contact structure 144 was formed in an opening that was formed in the gate cap 114 so as to expose a portion of the gate electrode 112. The gate contact structure 144 may be comprised of the same material as that of the source/drain contact structures 162. The source/drain contact structures 162 (FIG. 8) and the gate contact structure 144 (FIG. 9) are typically referred to as device level contact structures as they provide a means for electrical communication between the various devices, e.g., transistors, resistors, anti-fuse devices, etc., that are formed on or immediately adjacent the semiconductor substrate.

With continued reference to FIGS. 8 and 9, in this example, the M1 metallization layer was formed on the IC product. As shown in FIG. 8, the M1 metallization layer comprises a plurality of conductive vias 168 ("V0" vias) and a plurality of conductive lines 170 positioned above the source/drain contact structures 162. As shown in FIG. 9, the M1 metallization layer comprises a conductive via 169 (a "V0" via) and a conductive line 171 positioned above the gate contact structure 144. Although the conductive vias and the conductive lines are depicted as being separate structures, in some cases, they may be a unitary structure, e.g., when damascene processing techniques are employed to make the conductive vias and the conductive lines. As depicted in FIG. 8, each of the conductive vias 168 conductively contacts one of the source/drain contact structures 162, thereby conductively coupling the conductive lines 170 to the source/drain contact structures 162 and ultimately the source/drain contact structures 140. As depicted in FIG. 9, the conductive via 169 conductively contacts the gate contact structure 144, thereby conductively coupling the conductive line 171 to the gate electrode 112.

Next, the M2 metallization layer was formed on the IC product above the M1 metallization layer. As shown in FIG. 8, the M2 metallization layer comprises a plurality of conductive vias 174 ("V1" vias) and conductive lines 176, 177 positioned above the source/drain contact structures 162. As shown in FIG. 9, the M2 metallization layer comprises a conductive via 173 (a "V1" via) and a conductive line 179 positioned above the gate contact structure 144. As before, the conductive vias and the conductive lines are depicted as being separate structures, but in some cases they may be a unitary structure. As depicted in FIG. 8, one of the conductive vias 174 conductively contacts the conductive line 176 while the other conductive via 174 conductively contacts the conductive line 177. The conductive lines 176, 177 are connected to other circuits on the IC product. As shown in FIG. 9, the conductive via 173 is conductively coupled to the conductive line 179 thereby conductively coupling the conductive line 179 to the conductive gate electrode 112 of the anti-fuse device 100A. The conductive vias 168, 169, 174, 173 and the conductive lines 170, 176 and 179 may comprise any conductive material, e.g., tungsten, copper, etc.

As indicated in FIG. 9, the above-described programing voltage $PV_A$ may be applied to the conductive gate electrode 112 of the anti-fuse device 100A via the conductive line 179 in the M2 metallization layer to program or activate the anti-fuse device 100A, i.e., to break down the gate insulation layer 110 of the gate structure 108A so as to create a conductive connection or flow path between the gate electrode structure 112 and the source/drain regions of the anti-fuse device 100A, as simplistically depicted by the bold arrows 180 in FIG. 8.

As noted above, by selecting the fin pitch on the anti-fuse devices 100 disclosed herein, the breakdown voltage of such anti-fuse devices 100 may be controlled or tuned so as to produce anti-fuse devices 100 having a particular and pre-selected breakdown voltage. When it is desired to produce an anti-fuse device 100A having a relatively high breakdown voltage, a relatively large fin pitch 106A is used. Conversely, when it is desired to produce an anti-fuse device 100B having a relatively low breakdown voltage, a relatively small fin pitch 106B is used.

Figure 10:
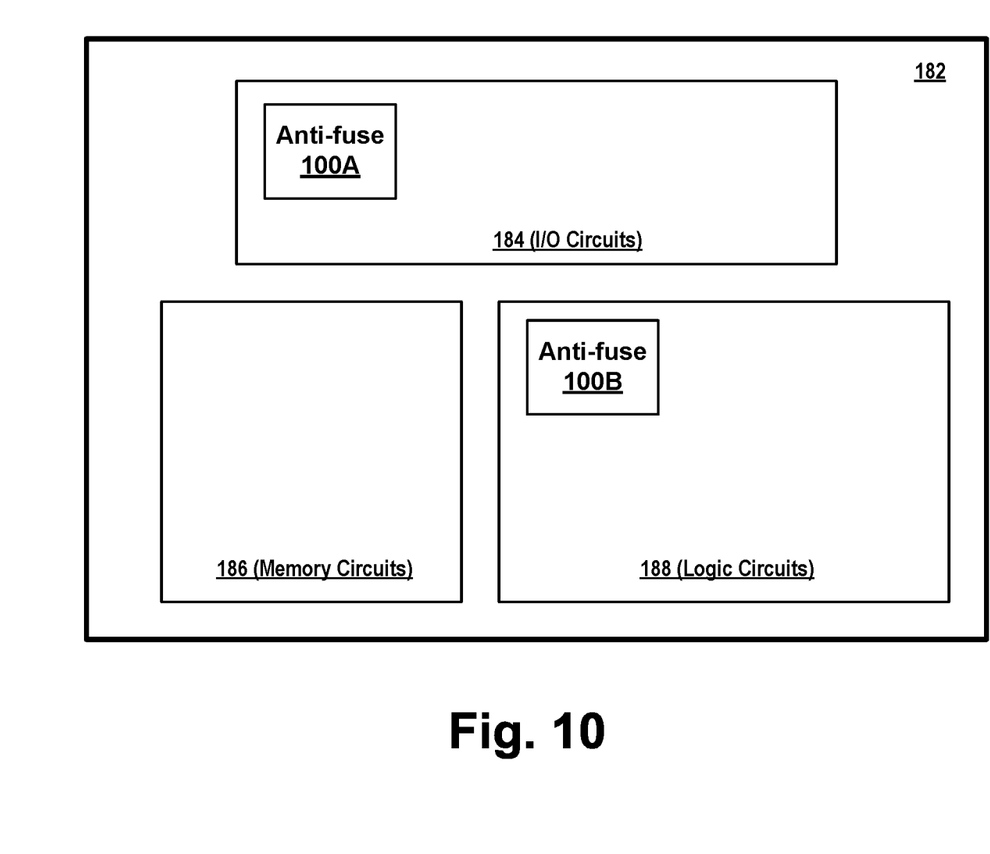

Moreover, multiple anti-fuse devices 100, each of which has different breakdown voltages, may be formed on the same IC product or chip. For example, FIG. 10 is a simplistic depiction of a single IC product 182. In this example, the IC product comprises an I/O region 184 that contains input/output circuits, a memory region 186 that contains memory circuits and a logic region 188 that contains logic circuits. In one illustrative example, the anti-fuse devices 100A (with a relatively higher breakdown voltage) may be used in the I/O region 184 while the anti-fuse devices 100B (with a relatively lower breakdown voltage) may be used in the logic region 188. Of course, the IC product 182 can have any number of classes of anti-fuse devices 100, wherein each class of anti-fuse device is designed and manufactured so as to have a unique breakdown voltage. For example, the IC product 182 may contain five or six different classes of anti-fuse devices 100 used in different areas or regions of the IC product 182.

Figure 11:
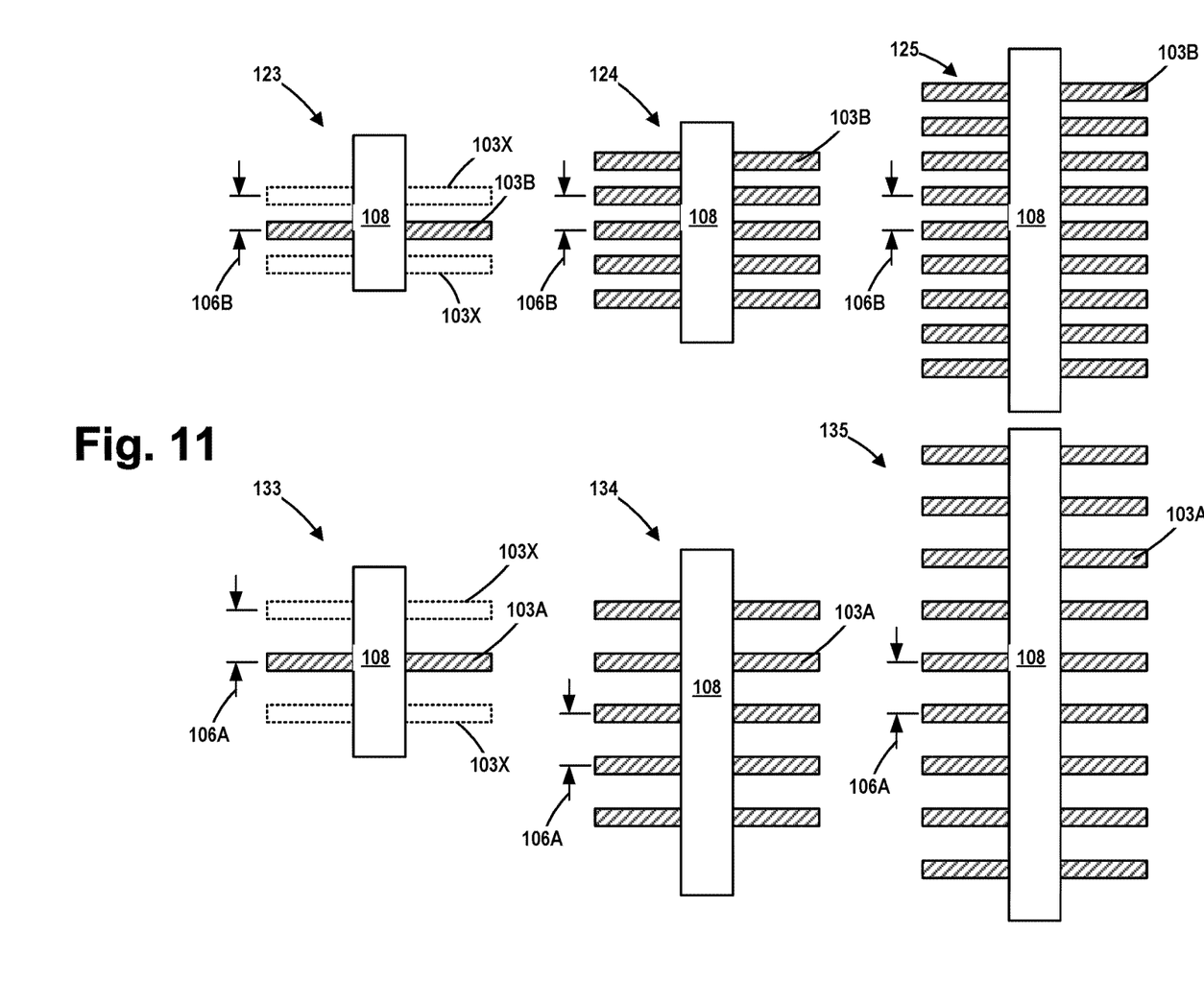

As noted above, the anti-fuse devices 100 disclosed herein may comprise any number of fins 103 (e.g., a single fin 103, more than two fins 103, an even number of fin 103, an odd number of fins 103, etc.) and the anti-fuse devices 100 formed on an IC product need not have the same number of fins 103, although that may be the case in some applications. FIG. 11 depicts six illustrative embodiments of various anti-fuse devices 100 disclosed herein. The anti-fuse devices 100 in the upper portion of FIG. 11 have been identified with the numerals 123, 124 and 125 for reference purposes. The anti-fuse devices 100 in the lower portion of FIG. 11 have been identified with the numerals 133, 134 and 135 for reference purposes. The fins 103B for the anti-fuse devices 123, 124 and 125 have all been formed with the smaller fin pitch 106B. The fins 103A for the anti-fuse devices 133, 134 and 135 have all been formed with the larger fin pitch 106A.

As depicted in FIG. 11, the anti-fuse devices 123, 124 and 125, respectively, comprise one, five and nine, respectively, of the fins 103B. The anti-fuse devices 133, 134 and 135, respectively, also comprise one, five and nine, respectively, of the fins 103A. As before, all of the anti-fuse devices 123, 124 and 125 have substantially the same breakdown voltage. All of the anti-fuse devices 133, 134 and 135 have substantially the same breakdown voltage, but the breakdown voltage for the anti-fuse devices 133, 134 and 135 is greater than the breakdown voltage for the anti-fuse devices 123, 124 and 125. Accordingly, the anti-fuse devices 133, 134 and 135, respectively, have a higher breakdown voltage than the anti-fuse devices 123, 124 and 125, respectively.

In the case where the final anti-fuse device 100 comprises a single fin 103 (e.g., the anti-fuse structures 123 and 133 shown in FIG. 11), a plurality of fins 103 may be initially formed in the substrate with the desired or targeted fin pitch to produce the fins with the desired upper surface width (or critical dimension—see, e.g., the dimensions 109A or 109B in FIGS. 2 and 3) to produce an anti-fuse device with a desired or targeted breakdown voltage. Thereafter, adjacent fins 103X (shown in dashed lines) may be removed or cut, thereby leaving only a single fin with the desired upper surface width.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. An integrated circuit product, comprising:
   a semiconductor substrate;
   a first anti-fuse device formed on the semiconductor substrate, the first anti-fuse device comprising at least one first fin formed with a first fin pitch, a first source region and a first drain region, wherein the first anti-fuse device is adapted to breakdown when a first programing voltage is applied to the first anti-fuse device;
   a second anti-fuse device formed on the semiconductor substrate, the second anti-fuse device comprising at least one second fin formed with a second fin pitch, a second source region and a second drain region, wherein the second anti-fuse device is adapted to breakdown when a second programing voltage is applied to the second anti-fuse device, wherein the first fin pitch is greater than the second fin pitch and wherein the first programming voltage is greater than the second programing voltage; and
   a first region comprising input/output circuitry and a second region comprising logic circuitry, wherein the first anti-fuse device is positioned in the first region and the second anti-fuse device is positioned in the second region.

2. The integrated circuit product of claim 1, further comprising:
   a first gate structure positioned around a portion of the at least one first fin, the first gate structure comprising a first gate insulation layer and a first conductive gate electrode, wherein the first anti-fuse device is adapted to have the first programing voltage applied to the first conductive gate electrode so as to cause the first gate insulation layer to breakdown and thereby result in the formation of a first conductive electrical path between the first conductive gate electrode and both of the first source region and the first drain region; and
   a second gate structure positioned around a portion of the at least one second fin, the second gate structure comprising a second gate insulation layer and a second conductive gate electrode, wherein the second anti-fuse device is adapted to have the second programing voltage applied to the second conductive gate electrode so as to cause the second gate insulation layer to breakdown and thereby result in the formation of a second conductive electrical path between the second conductive gate electrode and both of the second source region and the second drain region.

3. The integrated circuit product of claim 1, wherein the at least one first fin consists of a single first fin and the at least one second fin consists of a plurality of second fins.

4. The integrated circuit product of claim 1, wherein the at least one first fin consists of a single first fin and the at least one second fin consists of a single second fin.

5. The integrated circuit product of claim 1, wherein the at least one first fin comprises a plurality of first fins and the at least one second fin comprises a plurality of second fins.

6. The integrated circuit product of claim 5, wherein the plurality of first fins comprises an odd number of fins and the plurality of second fins comprises an even number of fins.

7. The integrated circuit product of claim 1, further comprising an M2 metallization layer, the M2 metallization layer comprising a first conductive line and a second conductive line, wherein the first programming voltage is adapted to be applied to the first anti-fuse device by application of the first programming voltage to the first conductive line and wherein the second programming voltage is adapted to be applied to the second anti-fuse device by application of the second programming voltage to the second conductive line.

8. An integrated circuit product, comprising:
a semiconductor substrate;
a first anti-fuse device formed on the semiconductor substrate, the first anti-fuse device comprising a plurality of first fins formed with a first fin pitch, a first source region and a first drain region, wherein each of the plurality of first fins comprises a first upper surface with a first width and wherein the first anti-fuse device is adapted to breakdown when a first programming voltage is applied to the first anti-fuse device;
a second anti-fuse device formed on the semiconductor substrate, the second anti-fuse device comprising a plurality of second fins formed with a second fin pitch, a second source region and a second drain region, wherein each of the plurality of first fins comprises a second upper surface with a second width and wherein the second anti-fuse device is adapted to breakdown when a second programing voltage is applied to the second anti-fuse device, wherein the first fin pitch is greater than the second fin pitch, the first programming voltage is greater than the second programing voltage and wherein the first width is greater than the second width; and
an M2 metallization layer, the M2 metallization layer comprising a first conductive line and a second conductive line, wherein the first programming voltage is adapted to be applied to the first anti-fuse device by application of the first programming voltage to the first conductive line and wherein the second programming voltage is adapted to be applied to the second anti-fuse device by application of the second programming voltage to the second conductive line.

9. The integrated circuit product of claim 8, further comprising:
a first gate structure positioned around a portion of each of the plurality of first fins, the first gate structure comprising a first gate insulation layer and a first conductive gate electrode, wherein the first anti-fuse device is adapted to have the first programming voltage applied to the first conductive gate electrode so as to cause the first gate insulation layer to breakdown and thereby result in the formation of a first conductive electrical path between the first conductive gate electrode and both of the first source region and the first drain region; and
a second gate structure positioned around a portion of each of the plurality of second fins, the second gate structure comprising a second gate insulation layer and a second conductive gate electrode, wherein the second anti-fuse device is adapted to have the second programming voltage applied to the second conductive gate electrode so as to cause the second gate insulation layer to breakdown and thereby result in the formation of a second conductive electrical path between the second conductive gate electrode and both of the second source region and the second drain region.

10. The integrated circuit product of claim 8, wherein the plurality of first fins comprises an even number of fins and the plurality of second fins comprises an odd number of fins.

11. An integrated circuit product, comprising:
a semiconductor substrate;
a first anti-fuse device formed on the semiconductor substrate, the first anti-fuse device comprising at least one first fin formed with a first fin pitch, a first source region and a first drain region, wherein the first anti-fuse device is adapted to breakdown when a first programing voltage is applied to the first anti-fuse device; and
a second anti-fuse device formed on the semiconductor substrate, the second anti-fuse device comprising at least one second fin formed with a second fin pitch, a second source region and a second drain region, wherein the second anti-fuse device is adapted to breakdown when a second programing voltage is applied to the second anti-fuse device, wherein the first fin pitch is greater than the second fin pitch and wherein the first programming voltage is greater than the second programing voltage,
wherein the at least one first fin comprises a first upper surface with a first width and the at least one second fin comprises a second upper surface with a second width, wherein the first width is greater than the second width.

12. The integrated circuit product of claim 11, wherein the plurality of first fins comprises an even number of fins and the plurality of second fins comprises an odd number of fins.

* * * * *